(12) United States Patent
Pepper et al.

(10) Patent No.: US 7,734,271 B2
(45) Date of Patent: Jun. 8, 2010

(54) WAVEGUIDE SAMPLERS AND FREQUENCY CONVERTERS

(75) Inventors: Steven H. Pepper, Portland, OR (US); John Ebner, Portland, OR (US); Robert Norton, Beaverton, OR (US)

(73) Assignee: Picosecond Pulse Labs, Boulder, CO (US)

( * ) Notice: Subject to any disclaimer, the term of this patent is extended or adjusted under 35 U.S.C. 154(b) by 666 days.

(21) Appl. No.: 11/572,985

(22) PCT Filed: Aug. 1, 2005

(86) PCT No.: PCT/US2005/027586

§ 371 (c)(1),
(2), (4) Date: Jan. 30, 2007

(87) PCT Pub. No.: WO2006/015367

PCT Pub. Date: Feb. 9, 2006

(65) Prior Publication Data

US 2007/0273458 A1   Nov. 29, 2007

Related U.S. Application Data

(60) Provisional application No. 60/592,433, filed on Jul. 30, 2004.

(51) Int. Cl.
*H04B 1/26* (2006.01)
*H04B 3/04* (2006.01)

(52) U.S. Cl. ............... 455/313; 455/258; 455/325; 333/20

(58) Field of Classification Search ............ 455/313, 455/258, 325, 327; 333/20, 137
See application file for complete search history.

(56) References Cited

U.S. PATENT DOCUMENTS

| | | | |
|---|---|---|---|
| 5,267,020 | A | 11/1993 | Marsland et al. |
| 6,242,899 | B1 | 6/2001 | Miller |
| 7,602,333 | B2 * | 10/2009 | Hiramatsu et al. ......... 455/313 |
| 7,612,628 | B2 * | 11/2009 | Agoston et al. ............ 333/20 |
| 2002/0145484 | A1 * | 10/2002 | Agoston et al. ............ 333/20 |
| 2002/0167373 | A1 | 11/2002 | Agoston et al. |

OTHER PUBLICATIONS

Written Opinion of the International Searching Authority, dated Dec. 27, 2005, PCT/US2005/027586, filed Aug. 1, 2005.

* cited by examiner

*Primary Examiner*—Lana N Le
(74) *Attorney, Agent, or Firm*—Klarquist Sparkman, LLP

(57) ABSTRACT

Frequency converters include waveguides configured for a local oscillator (LO) signal, an intermediate frequency (IF) signal, and an RF signal. A multimode IF waveguide can be used for selectively coupling of an IF signal and to reduce signal contributions produced by the LO signal. Typically, the multimode waveguide is situated to that the IF signal and the LO signal propagate in different waveguide modes, and a selected one of these signals can be selectively attenuated. In some examples, a periodically stepped waveguide is used to enhance propagation of a selected waveguide mode or a lossy conductor is used to attenuate a selected waveguide mode.

12 Claims, 10 Drawing Sheets

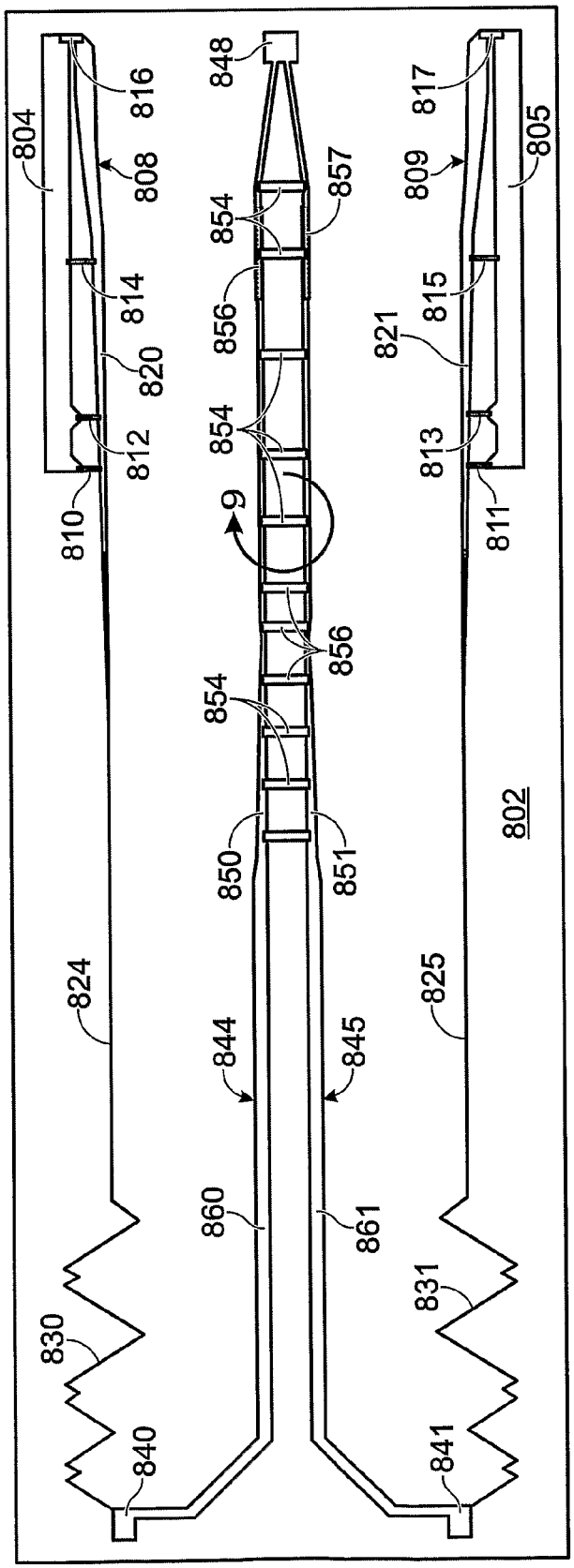

WAVEGUIDE SAMPLERS AND FREQUENCY CONVERTERS

CROSS-REFERENCE TO RELATED APPLICATIONS

This application claims the benefit of U.S. Provisional Patent Application 60/592,433, filed Jul. 30, 2004, that is incorporated herein by reference.

TECHNICAL FIELD

The disclosure pertains to electrical circuits associated with wideband signal processing operations such as signal upconversion and downconversion

BACKGROUND

The processing and analysis of wide bandwidth electrical signals presents formidable challenges. For example, the clock rates of conventional analog to digital converters are inadequate to capture wideband signals in real time. Characterization of such electrical signals is also difficult. Conventional sampling systems used for signal acquisition and measurement tend to transmit portions of sample strobe pulses used to capture signal samples along with the signal samples so that measurements include artifacts associated with the strobe pulses. In addition, conventional samplers tend to operate at low strobe rates and provide sampled signal (IF) or other processed output signals based on charge accumulated on sample capacitors, and thus IF bandwidths and sensitivities are limited. In view of these and other shortcomings, improved signal acquisition and conversion systems are needed.

SUMMARY

Examples of samplers, systems that include samplers such as upconverters and downconverters, and components for sampler and associated methods are disclosed. In an example, a sampler comprises a strobe waveguide coupled to receive a strobe pulse and a least one sampler diode in communication with the strobe waveguide. The sampler includes a first signal waveguide and a second signal waveguide, wherein the second signal waveguide is configured to capture a signal, and the first signal waveguide and the second signal waveguide are configured to be selectively coupled based on application of a strobe pulse to the at least one sampler diode. In some examples, first and second sampler diodes are in communication with the strobe waveguide. In additional examples, a first and second pair of sampler diodes are in communication with the strobe waveguide, wherein the first signal waveguide includes first and second portions and the first portion is configured to receive a signal corresponding to a captured input signal from the second waveguide at a first time and the second portion is configured to receive a signal corresponding to the captured signal from the second waveguide at a second time. In other examples, a pulse forming network is configured to produce the strobe pulse, the pulse forming network comprising a control input configured to select a time interval between a leading edge and a falling edge of the strobe pulse. In further examples, the first signal waveguide is coupled to receive a portion of the strobe pulse in a first propagation mode and a captured signal from the second signal waveguide in a second propagation mode. In other illustrative examples, the first propagation mode and the second propagation mode are different waveguide modes.

A method comprises directing a portion of a signal to a capture waveguide and applying a strobe pulse. A signal corresponding to the portion of the input signal propagating on the capture waveguide is coupled to an output waveguide in response to application of the strobe pulse. In other examples, the strobe pulse is applied to at least a first and a second sampler diode. A first signal corresponding to the portion of a signal propagating on the capture waveguide at a first output waveguide at a first time point and a second signal corresponding to the portion of the signal propagating on the capture waveguide at a second time point are received. In other examples, the strobe pulse is processed to produce a first strobe portion having a first polarity at the first time point and a second strobe portion having a second polarity at the second time point.

A signal translator comprises a local oscillator input configured to receive a local oscillator signal, a translator input configured to receive an input signal for frequency translation, and a translator output. At least one sampler diode is configured to couple a portion of the input signal as a translated signal to the translator output in response to a local oscillator signal coupled to the sampler diode from the local oscillator input In other examples, the translator output comprises a first output coupled to the translator input in response to a first portion of the local oscillator signal and a second output coupled to the translator input in response to a second portion of the local oscillator signal. In further examples, the translator input comprises a first input coupled to the translator output in response to a first portion of the local oscillator signal and a second input coupled to the translator output in response to a second portion of the local oscillator signal. In additional examples, a local oscillator source is configured to deliver a series of strobe pulses to the at least one diode, wherein the frequency translated signal consists essentially of a corresponding series of pulses modulated based on the input signal.

Apparatus comprise a waveguide configured to propagate a first signal in a first waveguide mode and a second signal in a second waveguide mode that is different from the first waveguide mode, wherein the waveguide is configured so that an impedance associated with the first mode is substantially constant and an impedance associated with the second mode varies. In other examples, the waveguide includes a gap situated between waveguide conductors, and the waveguide includes a plurality of sections having a first width and a plurality of sections having a second width, wherein the first width and the second width are different. In other examples, the waveguide includes a plurality of sections having a first gap and a plurality of sections having a second gap. In still further examples, at least one conductor situated to attenuate the second waveguide mode.

A sampler comprises a strobe waveguide defined by at least a first conductor and a second conductor and an RF waveguide and a multimode IF waveguide. A first sampler diode pair and a second sampler diode pair are provided. One diode of the first pair has a cathode connected to the RF waveguide and an anode coupled to the multimode IF waveguide, and the other diode of the pair having an anode connected to the RF waveguide and a cathode coupled to the multimode IF waveguide. One diode of the second pair has a cathode connected to the RF waveguide and an anode coupled to the multimode IF waveguide, and the other diode of the pair having an anode connected to the RF waveguide and a cathode coupled to the multimode IF waveguide. A first conductor of the strobe waveguide is configured to couple a strobe pulse to the multimode IF waveguide and the first sampler diode pair and the second conductor of the strobe waveguide are configured to couple the strobe pulse to the second IF waveguide and the second sampler diode pair so that the first IF waveguide and the multimode IF waveguide are coupled to the RF waveguide in response to the strobe pulse. In other examples, a termination is coupled to the RF waveguide. In additional examples, a backshort is in communication with the strobe waveguide and configured to reflect at least a portion of a strobe signal to the sampler diode pairs. In further examples, the termination is configured to provide an impedance match. In additional examples, a termination is coupled to the multimode IF waveguide. In representative examples, the termination provides a predetermined impedance. In other examples, the multimode IF waveguide is coupled to propagate an IF signal in a first waveguide mode and the strobe pulse in a second waveguide mode that is different from the first waveguide mode. In further examples, the multimode IF wave guide includes a first waveguide conductor coupled to an anode of one of the diodes of the first pair of sampler diodes and a second waveguide conductor coupled to a cathode of the other of the diodes of the first pair.

A sampler comprises a strobe waveguide defined by at least a first conductor and a second conductor, an RF waveguide, and first and second IF waveguides. A first sampler diode has a cathode connected to the RF waveguide and an anode connected to the first IF waveguide. A second sampler diode has an anode connected to the RF waveguide and a cathode connected to the second IF waveguide, wherein the first IF waveguide and the second IF waveguide are configured to be coupled to the RF waveguide in response to a strobe pulse applied to the strobe waveguide. In some examples, the IF waveguide and the RF waveguide are coplanar waveguides, and the strobe waveguide is a coplanar strip waveguide. In additional examples, the strobe waveguide is configured to deliver at least a portion of the strobe signal so as to propagate in a first mode on the first and second IF waveguides and the sampler diodes are configured to couple the RF waveguide and the IF waveguides so that a signal coupled from the RF waveguide to the IF waveguides propagates in second waveguide mode that is different than the first waveguide mode. In other examples, a mode restrictor is in communication with at least one of the first and second IF waveguides and configured to reduce mode coupling.

These and other features of the disclosed technology are set forth below with reference to the accompanying drawings.

BRIEF DESCRIPTION OF THE DRAWINGS

FIG. 8 is a physical layout of a signal combiner that includes an IF waveguide and DC coupled bias conductors.

FIG. 9 is a schematic diagram of a resistor/capacitor network used in the signal combiner of FIG. 8.

DETAILED DESCRIPTION

Figure 1A:
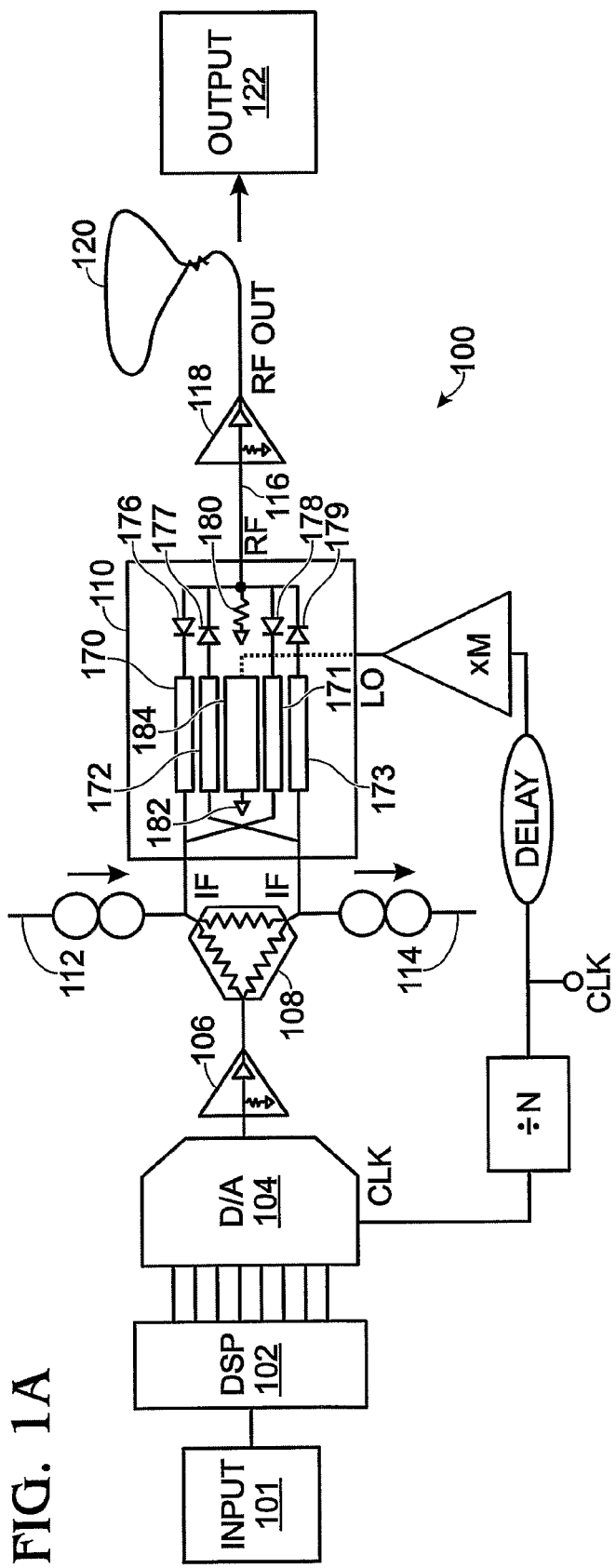
FIG. 1A is a block diagram of a single-channel, real-time upconverter.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Representative examples of the disclosed technology are described below. These examples illustrate particular features and combinations of features of the technology, and are selected for convenient presentation. Examples include sampler-based wideband upconvertors that can be included in a digital radar or a wideband communication system. Such upconverters can be configured to translate electrical signals having baseband bandwidths of DC to 35 GHz into mm-wave band electrical signal at mm-wave frequencies of up to about 200 GHz. Such upconverters can include a sampler-based monocycle pulse generator, and can provide significantly higher power levels in a mm-wave band than a simple upconverter. Schottky diode switches and non-linear transmission lines (NLTLs) can be used to produce an amplitude-modulated pulse train with fundamental local oscillator (LO) frequencies of up to at least 30 GHz with harmonics extending to at least 200 GHz. Wideband (RF) pulse shapes can be tailored to increase power levels over specific RF bandwidths. Modulation bandwidths can be in a range of from DC to at least about 35 GHz. In other examples, wideband downconverters are described that can be configured to translate electrical signals at mm-wave frequencies into baseband electrical signals.

Also disclosed herein are exemplary methods by which disclosed embodiments can operate or be operated. Exemplary environments and applications for the disclosed embodiments are also disclosed. The described systems, apparatus, and methods should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Examples of the disclosed technology are provided below. Some nonlinear transmission line (NLTL) based pulse and signal shaping networks and NLTL based samplers that can be used in the disclosed examples are described in more detail in U.S. Pat. No. 6,900,710 and U.S. Patent App. Pub. 2002/145484, both of which are incorporated herein by reference. In some examples, frequency translated (upconverted and downconverted) signals are produced. Downconverted signals typically have modulation bandwidths that are similar to those of the corresponding signal prior to downconversion, but are located at carrier frequencies that are less than a carrier frequency associated with the input signal. An upconverted signal is located at a carrier frequency that is greater than a carrier frequency of the corresponding input signal. In some examples, signals are downconverted so as to be situated at or near DC.

EXAMPLE 1

With reference to FIG. 1, a single-channel, real-time upconverter 100 includes a digital signal processor (DSP) 102 coupled to receive a digital baseband signature input signal from a baseband signal source 101. The DSP 102 is coupled to a digital-to-analog converter (DAC) 104 that delivers an analog signal associated with the baseband signature to an IF signal processor 106 that is typically configured as an IF amplifier but can include other processing such as spectral filtering, pulse shaping, or other functions. The IF processor is coupled to a splitter 108 that couples an IF signal associated with the baseband signature to a sampling pulse modulator 110. The splitter 108 is coupled to receive bias signals such as one or more bias currents through bias inputs 112, 114. The sampling pulse modulator 110 is configured to produce an RF output at a modulator output 116 that is typically amplified or otherwise processed by an amplifier 118. An output terminal of the amplifier 118 can be coupled to, for example, an antenna 120, a spectrum analyzer 122, or otherwise coupled.

The sampling pulse modulator 110 comprises conductors 170, 172 and 171, 173 that form first and second coplanar strip (CPS) waveguides, and the conductors 170, 171, 172, 173 are coupled to respective sampler diodes 176, 177, 178, 179. A conductor 184 is configured to receive the sampling strobe and is terminated to ground at 182. An RF output is terminated by a resistor 180.

Figure 1D:
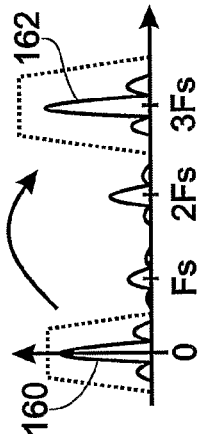
FIGS. 1B-1D depict electrical signals that illustrate the operation of the upconverter of FIG. 1A.
Figure 1C:
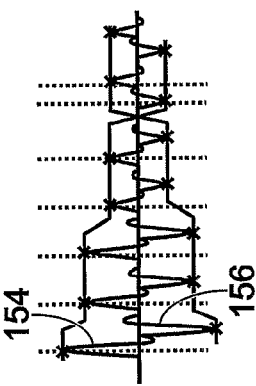
Figure 1B:
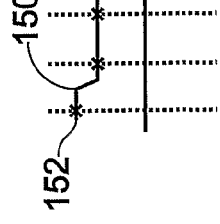

In operation, a digital baseband signature from the digital signal source 101 is coupled to the DSP 102 and DAC 104 to produce an analog input signal 150 as shown in FIG. 1B. FIG. 1B also indicates time points such as a representative time point 152 at which the sampling pulse modulator 110 is clocked. FIG. 1C illustrates alternating phase pulse pairs that are modulated by the analog input signal and produced at the sampling pulse modulator output. For example, a representative pulse pair comprising pulses 154, 156 is associated with the analog signal clocked at the time point 152. The sampling pulse modulator can be clocked by a sampler strobe received from a non-linear shock-line pulse-forming network driven from a fundamental sine wave, a multiplied LO sine wave, or other periodic or aperiodic signal. The shape and time offset of the alternating polarity RF pulses can be adjusted based on, for example, bias of Schottky diodes or other nonlinear device included in a non-linear shock line or other strobe pulse width control element to provide predetermined spectral power in a selected output frequency band. A sampler strobe pulse input to the sampling pulse modulator 110 initially activates, for example, the diodes 176, 179 and couples conductors 170, 173 to the RF output 116. The sampler strobe pulse propagates to the ground connection 182 and is reflected back toward the diodes 176-179. Upon reflection, the sampler strobe pulse is terminated. The next edge of the strobe is inverted in polarity and activates the diodes 177, 178, thereby coupling the conductors 172, 171 to the RF output 116. In this way, an alternating pulse pair modulated based on the digital baseband signal is produced. As shown in FIG. 1D, a baseband power spectrum 160 is upconverted to a carrier frequency of, for example, $3F_s$ that is a third harmonic of a sample clock frequency $F_s$. Other harmonics $NF_s$ can also be selected. While some output power is at harmonics other than the desired harmonic, selection of sampler strobe edge delay permits power to be preferentially coupled into a selected harmonic.

EXAMPLE 2

Figure 2:
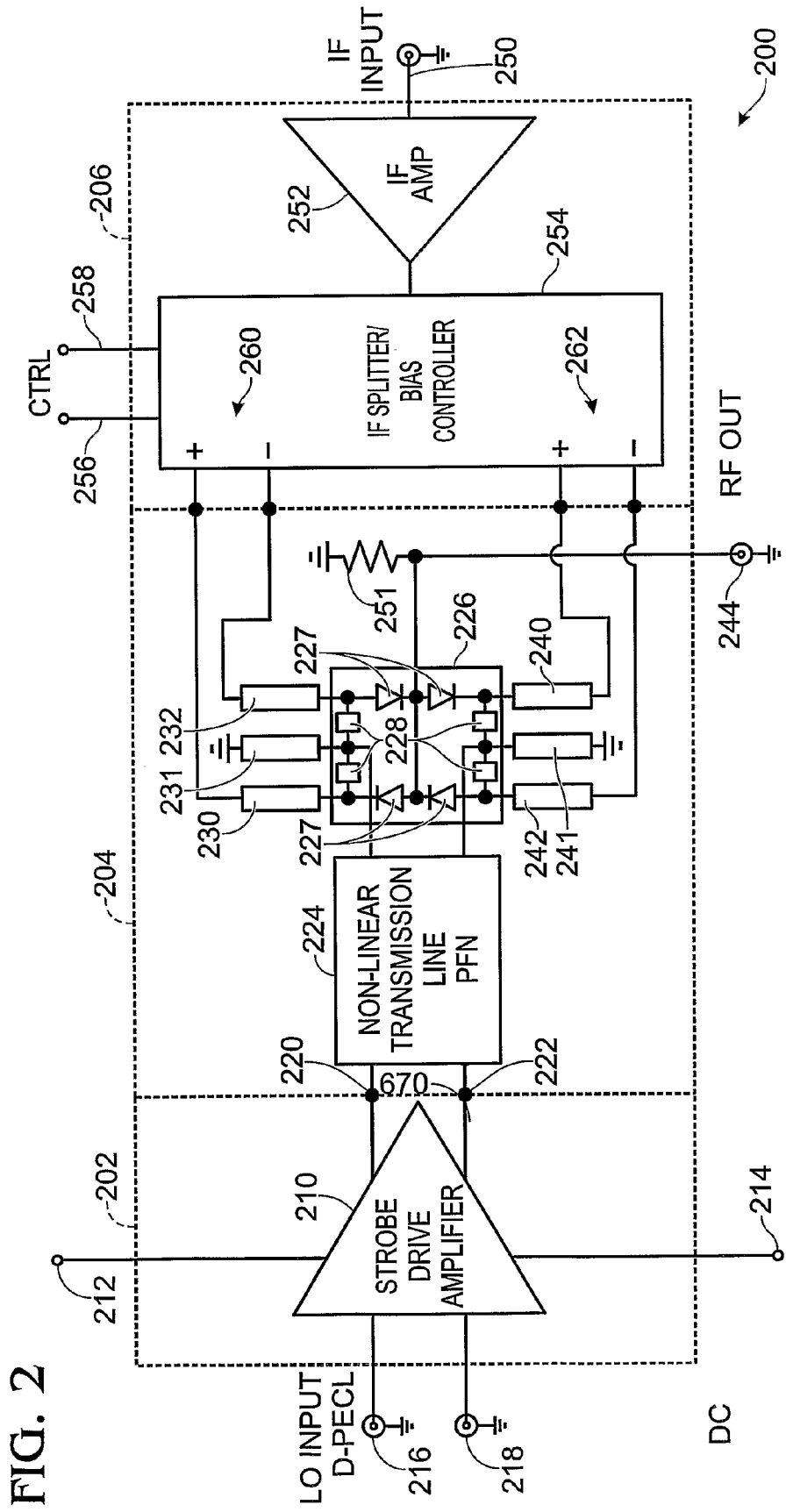
FIG. 2 is a block diagram of a multi-chip upconverter module.

With reference to FIG. 2, a multi-chip upconverter module 200 includes a local oscillator (LO) portion 202, a sampler system 204, and an intermediate frequency (IF) portion 206. The LO portion 202 comprises a strobe drive amplifier 210 that is coupled to receive control signals and DC bias at inputs 212, 214, respectively. Strobe inputs 216, 218 are configured to receive a local oscillator input signal, typically a differential positive emitter coupled logic (D-PECL) signal. A processed LO signal is delivered to inputs 220, 222 of a nonlinear transmission line (NLTL) pulse forming network (PFN) 224 that delivers a processed strobe pulse or series of strobe pulses to a sampling circuit 226 that includes four sampling diodes 227.

The sampler system 204 also includes conductors 230, 231, 232 and 240, 241, 242 that form a first multimode waveguide and a second multimode waveguide, respectively, terminated by circuit elements 228. In response to the processed pulse or pulse series produced by the PFN 224, the diodes 227 couple IF signals propagating on the conductors 230, 232 and 240, 242 to an RF output 244. The diodes 227 are typically reverse biased Schottky GaAs diodes that provide switching times of 1-2 ps, and the RF output is internally broadband terminated at terminator 251. Selection of diode bias permits control of RF bandwidth, noise figure/conversion loss, and linear dynamic range. High harmonic LO drive levels made possible by NLTL drive in combination with compatible mixer diode technology can provide high dynamic range, static and dynamic linearity.

The IF portion 206 is configured to receive an IF input signal at an IF input 250 and couple the IF input signal to an IF amplifier 252 and an IF controller 254 that serves as a bias controller for the sampler system 204 and as an IF splitter. The IF controller 254 includes differential output terminal pairs 260, 262 that couple IF signals and DC bias to the conductors 230, 232 and 240, 242 of the sampler system 204, respectively. In operation, IF signals on the conductors 230, 232, 240, 240 modulate the applied strobe pulses, and the modulated strobe pulses are coupled to the RF output 244.

Representative specifications of an upconverter system as described above are listed in the table below.

| Parameter | Units | Min | Max | Notes |
|---|---|---|---|---|
| RF Output Pulse Width | pS | 3 | 20 | Amplitude and Phase Modulated Impulses |
| Pulse repetition rate | GHz | DC | 35 | Single-Shot capability |
| Pulse Modulation (Envelope) Bandwidth | GHz | DC | 35 | Amplitude Modulation Bandwidth |
| Aperture Jitter | pS rms | | 0.25 | >6 mV/ps LO Input Slew Rate (Diff. ECL) |
| Conversion Loss | dB | | 6 | 500 mV$_{pp}$ out for ±1 V IF Input |
| Uncorrected Static Linearity | % | | 2 | At ±1 V IF input |

The use of high speed designs such as NLTLs and GaAs Schottky mixer diodes enables fast switching with high dynamic range. High bandwidth IF signal processing can provide real-time bandwidths of DC to at least 35 GHz.

EXAMPLE 3

A software defined radio ideally includes an Analog-to-Digital Converter (ADC) coupled to an antenna. In practical implementations, a downconverter and/or sample or Track-and Hold (T/H) device are used for signal processing prior to digitization at the ADC. Front-end subsystems such as, for example, downconverters and T/H devices typically determine system noise and linearity in receivers such as digital radar or communications receivers. Dynamic non-linearity is particularly troublesome, as it causes dynamic range as measured by "Effective Number of Bits" (ENOB) to degrade with RF frequency and signal level. In many digital IF systems, the T/H device that is situated ahead of the ADC determines critical system performance specifications. Thus, attention to the various sources of dynamic non-linearity can be used to preserve or improve the accuracy of the digital signal provided by the ADC. In this example, a representative sampler-based downconverter is described that performs both a downconversion and a hold function. The exemplary system provides an RF bandwidth of DC-100 GHz, an IF bandwidth of DC-13 GHz, and 10 effective bits noise and linearity at full 2V$_{p-p}$ input amplitude at sample rates exceeding 10 GS/sec.

Figure 3:
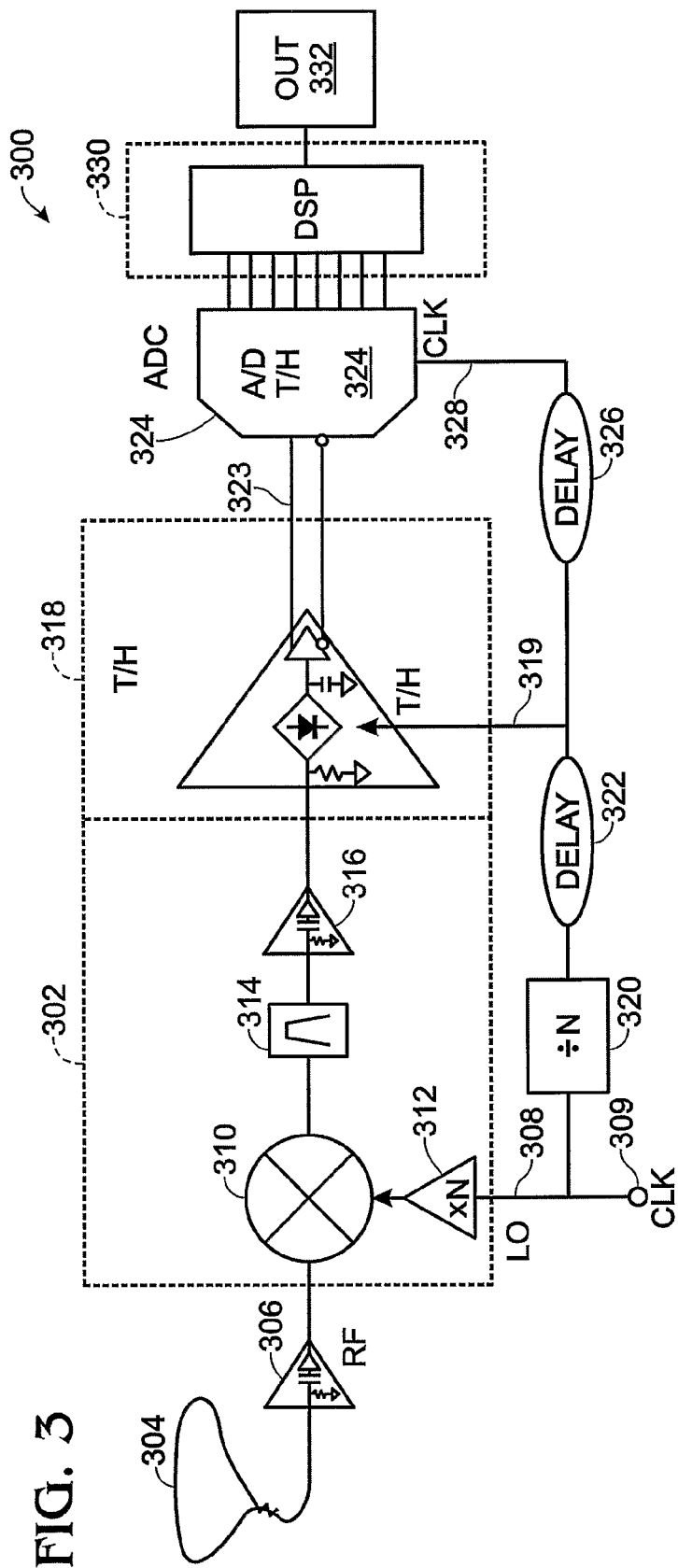
FIG. 3 is a block diagram of a single-channel, real-time digital radar receiver front end that includes a sampler-based downconverter.

With reference to FIG. 3, a single-channel, real-time digital radar receiver front end 300 comprises a sampling downconverter 302 that is configured to receive an RF signal received from, for example, an antenna 304 and a low noise preamplifier 306 or other amplifier. The downconverter 302 also includes a LO input 308 configured to receive a local oscillator signal or other periodic signal from a sample clock 309 or other signal source. The sample clock 309 typically produces periodic signal with substantial frequency components in a range of about 1-10 Gs. The downconverter 302 comprises a sampler/mixer 310 that is in communication with the preamplifier 306 and possibly a frequency multiplier 312 that is configured to produce an output signal component at a frequency about N times greater than the local oscillator signal applied to the LO input 308. The frequency multiplier 312 typically includes or is coupled to an amplifier as well. A product of the frequency multiplied LO signal and the RF signal is delivered to an IF filter 314 and an IF amplifier 316 to produce an IF signal that is delivered to a track and hold (T/H) amplifier 318. The T/H amplifier 318 is also configured to receive the local oscillator signal at a clock input 319 possibly through a frequency divider 320 (divide by N) and a delay line 322 and produce preferentially a differential output signal at a T/H output 323. An analog-to digital (ADC) converter 324 receives the differential output signal from the T/H amplifier 318 and a clock signal at an ADC clock input 328.

The clock signal delivered to the ADC 324 is typically based on the clock signal applied to the T/H amplifier 318 but with an additional delay introduced by the delay 326. A digital output from the ADC 324 can be coupled to a digital signal processor (DSP) 330, and a digital baseband signal produced as an output. The DSP 330 can be configured to provide digital calibration, correction, or other signal modifications.

EXAMPLE 4

A representative implementation of the functionality provided by the system of FIG. 3 is illustrated in FIGS. 4A-4E. A downconverter 400 is defined in a package 401 and includes a sampler 402 that is configured to receive an RF signal from a signal source 403. IF amplifiers 404, 406 are coupled to the sampler 402 and produce IF outputs that are delivered to an IF combiner 408. A Track and Hold amplifier (THA) 412 and an ADC converter 414 are implemented as an integrated circuit 410 such as a MAX 108 integrated circuit, available from MAXIM INTEGRATED PRODUCTS. A DSP 416 produces a digitally processed, downconverted output. A sampling clock signal is applied to the sampler 402 at a sampler input 418, and delays 420, 422 are provided to deliver respective clock signals to the THA 412 and the ADC 414.

Independent samples of an input RF input signal can be resolved by the THA 412 with nearly zero memory of any previous samples. IF signal processing can be selected based on a time-domain response of the THA 412 which can be provided separately or included with the ADC 414. A clock signal is applied to the THA 412 and timed to capture peaks of the IF samples. The sampler IF provides a fixed pulse shape to the THA. This significantly reduces the effects of dynamic non-linearity in the THA by converting the dynamic errors to static errors that are readily corrected in the DSP 416.

The sampler 402 includes sampler diodes 446, 448 that are configured to couple IF conductors 440, 441 to the RF input in response to an applied clock signal. The clock signal is coupled to strobe conductors 442 and short circuit termination 450 so as to reflect an input clock edge with a polarity inversion back to the sampler diodes 446, 448.

Figure 4A:
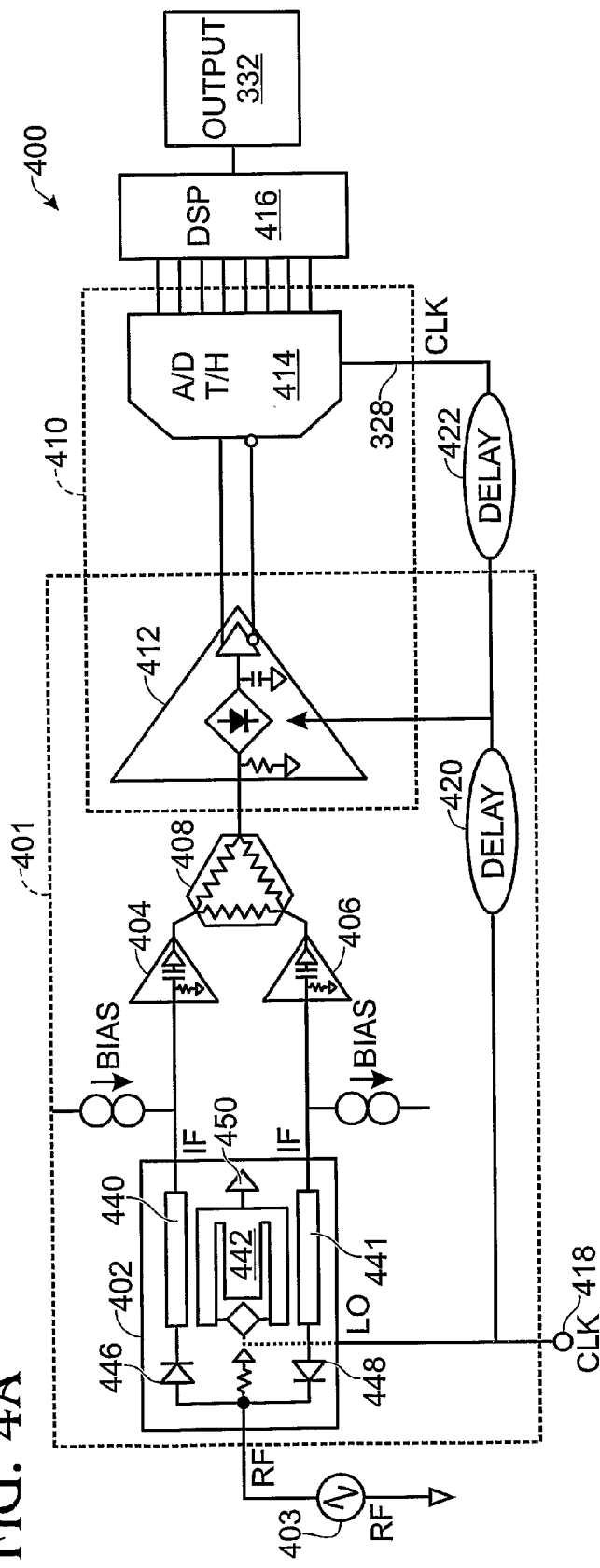
FIG. 4A is a block diagram illustrating a specific implementation of a sampler-based downconverter.
Figure 4E:
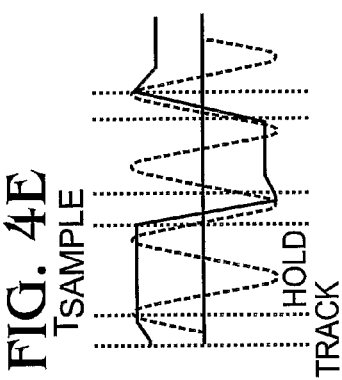
FIGS. 4B-4E depict electrical signals that illustrate the operation of the downconverter of FIG. 4A.
Figure 4D:
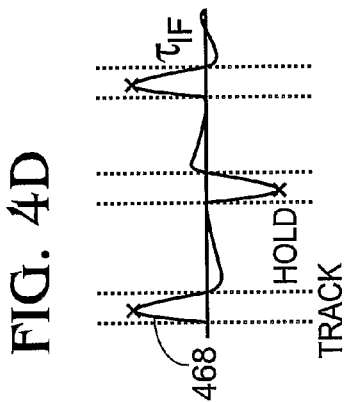
Figure 4C:
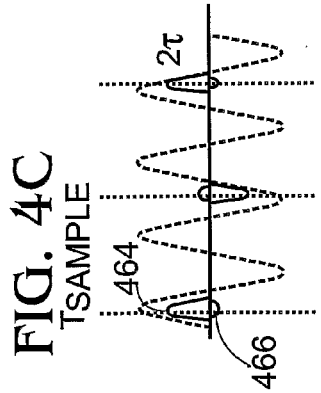
Figure 4B:
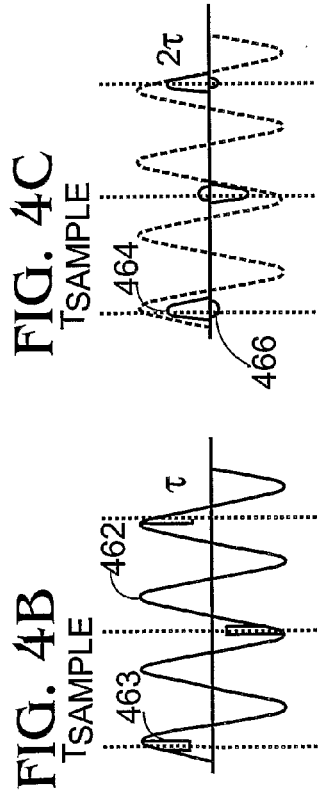

Operation of the downconverter 400 in a near-Nyquist, sub-sampled situation can be described with reference to FIGS. 4A-4E. Referring to FIGS. 4B-4E, a wideband (RF) signal 462 is input to the sampler 402, and portions or "samples" of the signal, such as representative sample 462 are coupled to the IF amplifiers 404, 406 in response to a sample clock signal delivered to the clock input 418. Referring to FIG. 4C, the sampler 402 produce an IF output signal that comprises positive and negative sampled portions of the RF input signal such as the representative positive and negative portions 464, 466 that are received from the conductors 440, 441, respectively. Referring to FIG. 4D, the IF amplifiers 404, 406 and the IF combiner 408 process the signal of FIG. 4C to produce an input signal 468 that is delivered to the THA 412. In order to reduce DC levels, the total charge accumulated in a sampling time is about zero. As shown in FIG. 4D, the signal 468 has substantially equal positive and negative voltage areas, and declines to about zero before tracking of a next sample. FIG. 4E illustrates an output of the THA 412 that is delivered to the ADC 414.

EXAMPLE 5

A multi-chip sampler module that supports 100 GHz and 10 Gs/sec is described in detail below with reference to FIG. 5. This representative sampler module includes a traveling-wave sampling architecture, LO drive, NLTL pulse-forming network, and IF signal processing. A coaxial RF input port is internally broadband terminated and the sampling diodes are reverse biased to provide control over trade-offs between noise figure, conversion loss, and linear dynamic range. GaAs Schottky diodes and NLTLs are used to provide (1-2 ps) commutating switches with low parasitics. NLTL technology provides high harmonic LO drive levels which can be combined with mixer diode technology to yield high dynamic range and exceptional static and dynamic linearity based on, for example, second and third intercept points 2IP and 3IP, respectively. In a typical example, correctable static linearity errors are predominantly associated with symmetrical, odd-order harmonics. Dynamic linearity errors are relatively small due to the speed and low parasitics of the diode switches. DSP algorithms can use finite impulse response filters (FIRs) with non-linear tap weights to correct static and certain residual dynamic non-linearities.

Figure 5:
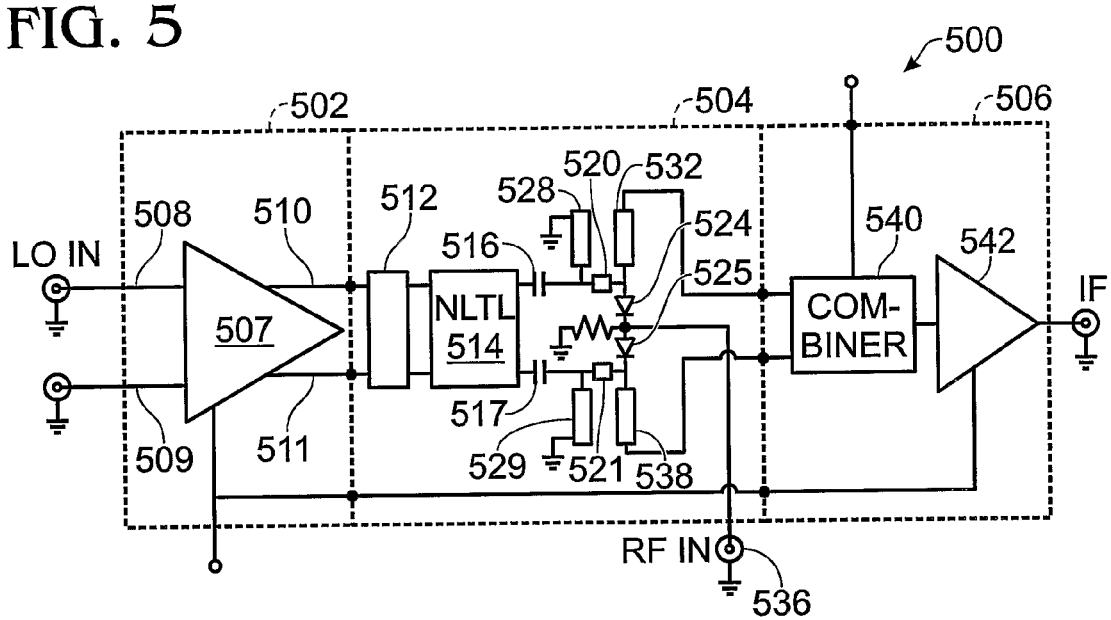
FIG. 5 is a block diagram of a two diode sampler that delivers a sampled output signal to an intermediate frequency waveguide.

Referring to FIG. 5, a sampling system 500 includes an LO processing portion 502, a sampler 504, and an IF portion 506. The LO portion 502 comprises a strobe drive amplifier 507 that is configured to receive an LO signal at differential LO inputs 508, 509 and provide a differential LO strobe signal at differential LO outputs 510, 511. The LO input signal to the LO portion 502 can be conveniently provided as an ECL step. The differential LO strobe signal is coupled to a balun 512 via a waveguide or other connection and then to an NLTL 514 of the sampler 504 to produce a differential sampler strobe signal that is coupled by capacitors 516, 517 and termination networks 520, 521 to sampling diodes 524, 525. The balun 512 is configured to remove or attenuate any common mode signal received from the strobe amplifier 507. For example, the strobe amplifier can be coupled to the balun 512 via a single ended signal, and the balun 512 configured to attenuate a common mode signal. In some examples, the termination networks 520, 521 can be omitted or replaced by inductors, resistors, capacitors, or combination thereof, and can provide impedance matching or impedance mismatching as suitable for a particular application.

The IF portion 506 includes a combiner 540 and an IF amplifier 542. The combiner 540 is configured to combine IF signals received from the conductors 538, 532 and produce a combined IF signal. In addition, the combiner 540 is configured to supply DC bias to the conductors 538, 532 to establish operating bias for the sampler diodes 524, 525.

An RF input signal is coupled to an RF input 536, and in response to application of the sampler strobe pulse to the sampling diodes 524, 525, portions of the RF input signal are coupled to conductors 532, 538 of first and second coplanar strip (CPS) waveguides defined by conductors 528, 532 and 529, 538, respectively and propagate as differential mode signals on the first and second CPS waveguides. Portions of the sampler strobe pulse are also coupled to the first and second coplanar waveguides, and propagate as a common mode signal.

EXAMPLE 6

A reciprocal, balanced, interferometric, four diode sampler system can provide two correlated samples for each sample clock cycle. Time skew between samples is adjustable, and thus can be selected based on an intended application such as, for example, a correlating sampler or a monocycle pulse generator. Other applications includes ultrawideband (UWB) QAM signal generation and detection, image reject mixing, Correlated Double Sampling (CDS), clock recovery, and jitter analysis.

Figure 6A:
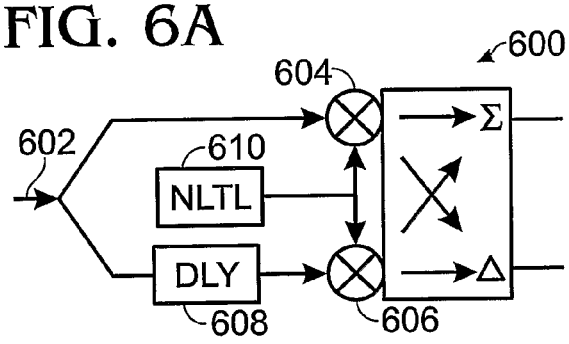
FIGS. 6A-6B are block diagrams of electrical interferometric systems configured as a delay line discriminator and a quadrature mixer, respectively.
Figure 6B:
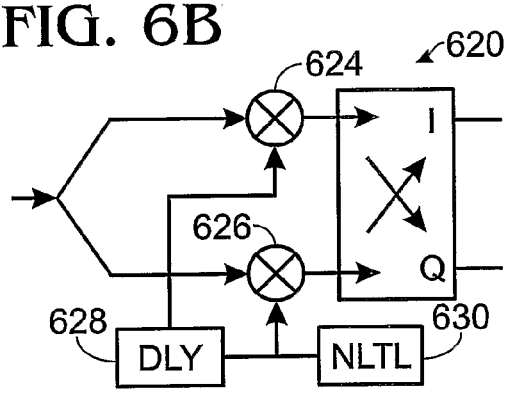
Figure 6C:
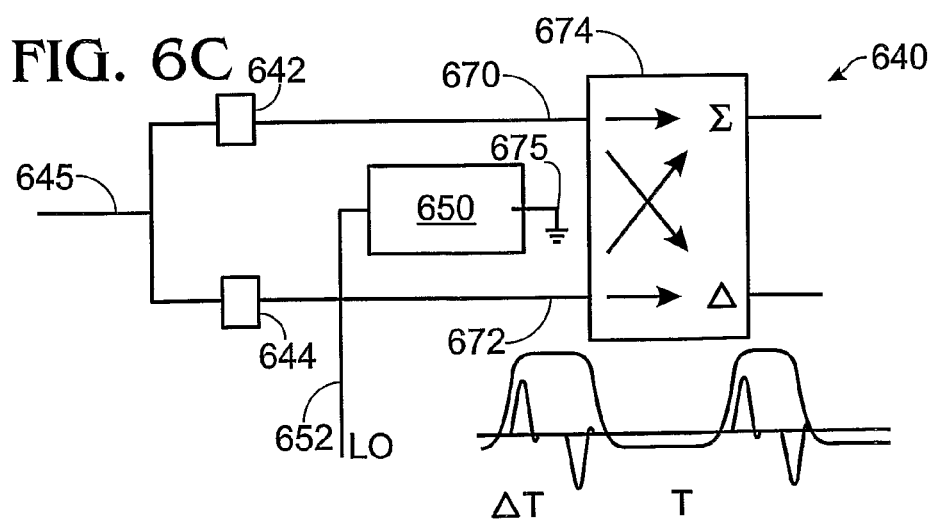
FIG. 6C is a block diagram of a dual sampler implementation of an electrical interferometer.

Referring to FIG. 6A, a delay line discriminator 600 includes a signal input 602 that is coupled to mixers 604, 606. A delay 608 is provided, and an LO signal is coupled to the mixers 604, 606 from, for example, an NLTL 610. Referring to FIG. 6B, a quadrature mixer 620 includes mixers 624, 626, a delay line 628, and an NLTL or other pulse source 630. Referring to FIG. 6C, a sampler 640 includes sampling diode sets 642, 644 that are coupled to receive a signal applied at an input 645 and to a multimode waveguide 650. A diode set can include one, two, three or more diodes or pairs of diodes. In addition, other nonlinear circuit elements can be used instead of diodes. An LO signal such as a sampler strobe is applied to the multimode waveguide 650, and activates at least one of the diode sets 642, 644 so that at least one of the conductors of the multimode waveguide 650 is coupled to one of the IF outputs 670, 672 of an output processor 674 that is configured to produce a sum (Σ) and a difference (Δ) of the signals coupled from the multimode waveguide 650. The LO drive signal (the strobe pulse) is differentiated by a backshort 675, and the electrical distance to the backshort determines a diode aperture time. Alternate LO edges strobe alternate diode switches at an aperture time difference set by a time width of the LO drive waveform.

Figure 7:
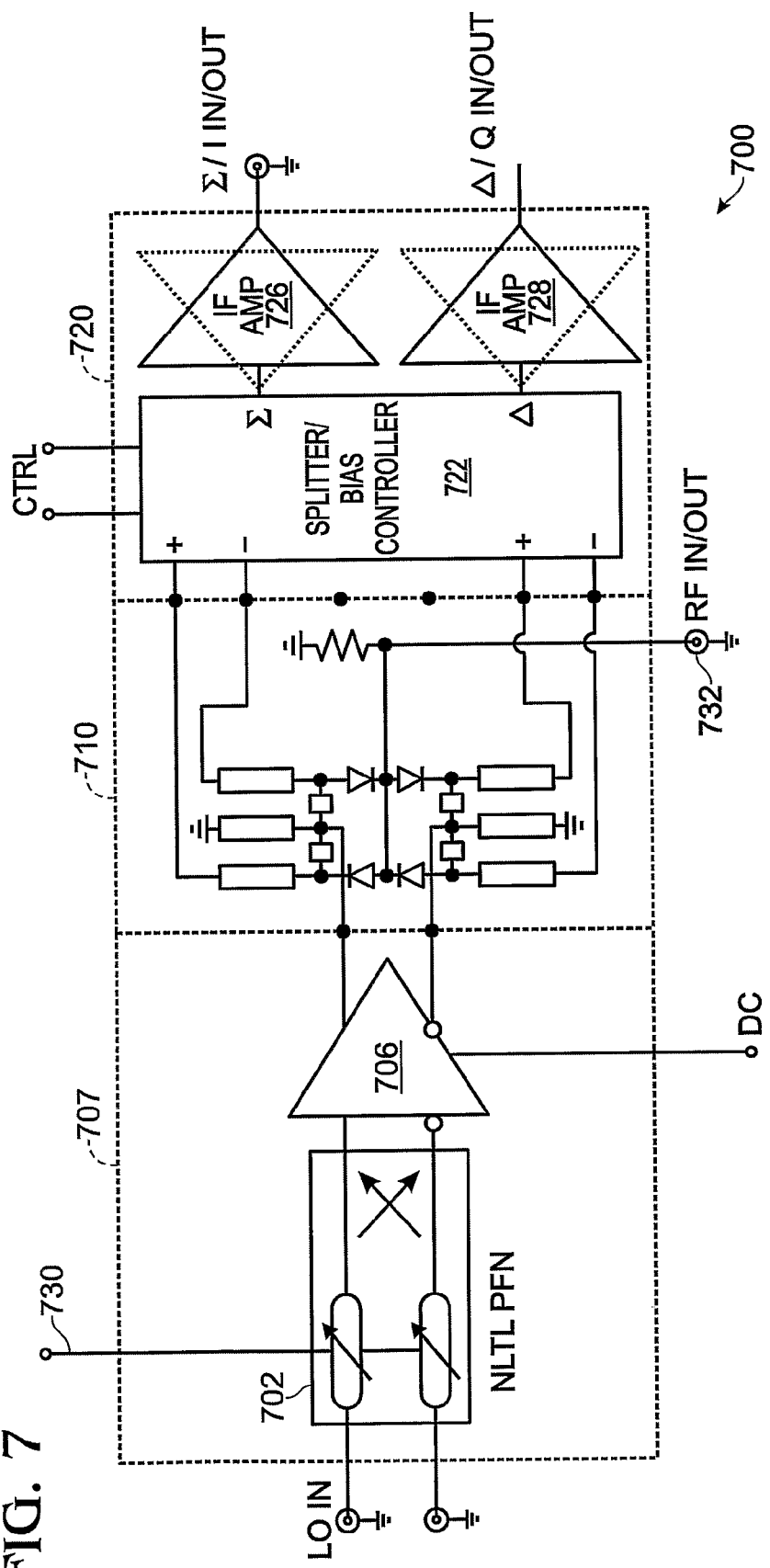
FIG. 7 is a block diagram of a quadrature correlator module.

FIG. 7 illustrates a quadrature-correlator sampling module 700. The module 700 includes an LO portion 707 that comprises an NLTL and NLTL pulse shaping network 702 and a strobe drive amplifier 706. A sampler portion 710 includes a four diode traveling wave sampler similar to that of FIG. 2 and an IF portion 720 includes a splitter/bias controller 722 and IF amplifiers 726, 728. The NLTL pulse-shaping network 702 comprises a variable delay line and a clipper network for selection of edge timing in response to a timing selection signal provided at a timing control input 730. A coaxial RF input port 732 is internally broadband terminated, and sampling diodes are reverse biased to provide control of RF bandwidth, noise figure/conversion loss, and linear dynamic range.

EXAMPLE 7

The block diagram of FIG. 7 with the directions of the IF amps 726, 728 interchanged depicts a UWB transmitter and receiver, respectively, that use DPSK pulse modulation. The upconverter (transmitter) and downconverter (receiver) are "tuned" to a desired mm-wave band by selection of strobe pulse and alternating pulse time separation. Monocycle pulses having polarities that are encoded (modulated) with digital data can be detected with a correlating receiver. Received signal components can be distinguished from noise or other signal degradation based on the alternating phase pulses that are associated with data transmissions. Such pulse pairs permit identification of data. DPSK modulation generally provides high immunity to both narrow and wideband interference. Other modulation formats, such as PAM, PPM, QAM and QPSK can also be used in such transmitters and receivers.

EXAMPLE 8

In some examples of the disclosed technology, sampler diode bias and signals such as IF signals share one or more conductors. Referring to FIG. 8, a representative bias/signal combiner 800 is defined on a dielectric or other substrate 802. The combiner 800 includes bias input conductors 804, 805 that are coupled to respective bias delivery conductors 808, 809 by RC shunts 810, 812, 814 and 811, 813, 815 and resistors 816, 817, respectively. In an example, resistors 816, 817 have values of about 25 Ohms to provide a total series resistance of about 50 Ohms. The bias delivery conductors include respective tapered portions 820, 821 and respective extension portions 824, 825. The extension portions 824, 825 are generally implemented as airbridged conductors. In view of the length of the portions 824, 825, these conductors are periodically airbridged with a period of about 50 μm (40 μm airbridge, 10 μm substrate land). To increase an effective length of these portions without increasing overall combiner length, terminal sections 830, 831 are defined as zigzag patterns that are also periodically airbridged to reduce capacitance and that terminate at respective IF input conductors 840, 841. In an example, the zigzag patterns of the terminal sections 830, 831 have impedances of about 170 Ohms. By configuring the bias delivery conductors in this manner, the bias delivery conductors have a relatively large impedance, and do not tend to receive significant portions of signal currents/voltages.

The IF input conductors 840, 841 are coupled to respective IF waveguide conductors 844, 845 that terminate at a pad 848. The IF waveguide conductors 844, 845 define a coplanar strip waveguide having an impedance of about 70 Ohms and include respective tapered portions 850, 851 and untapered portions 860, 861. The IF waveguide conductors 844, 845 are coupled to each other by a series of DC blocked resistors 854. As shown in FIG. 9, the DC block resistors 854 typically include a series connection of a resistor 901, a capacitor 902, and a resistor 903. The resistors 901, 903 are generally selected to have approximately the same value. The waveguide conductors 844, 845 include respective series capacitors 856, 857 that are conveniently defined by provided overlapping conductor portions that are separated by a dielectric layer. In contrast to the bias delivery conductors 824, 825 that have decreasing impedance per unit length from the IF input conductors 840, 841 to the bias input conductors 804, 805, the tapered portions 850, 851 of the waveguide conductors 844, 845 taper so as to have an increasing impedance.

The IF conductors 844, 845 form a CPS waveguide that can support common mode and differential mode signal propagation. However, the DC blocked resistors 854 do not substantially interact with common mode signals, but attenuate differential mode signals. Thus, the IF waveguide permits common mode signal propagation while attenuating differential mode signals. Effective propagation lengths of the untapered portions 860, 861 and the zigzag conductors 830, 831 are selected to be approximately the same so as to reduce signal reflections for signals applied to the IF input conductors 840, 841.

As shown in FIGS. 8-9, the combiner 800 is configured to couple DC bias voltages to, for example, sampling diodes from IF input conductors 840, 841. In addition, the combiner 800 is configured to receive an IF signal at the IF input conductors 840, 841 and propagate the IF input signal along a CPS waveguide to an output 848. The CPS waveguide is configured to attenuate any differential mode signals such as, for example, portions of strobe signals received from a sampler. In addition, the CPS waveguide can be configured to shape impulse response and to provide an impedance translation for an IF signal by, for example, tapering a CPS waveguide.

EXAMPLE 9

Figure 10A:
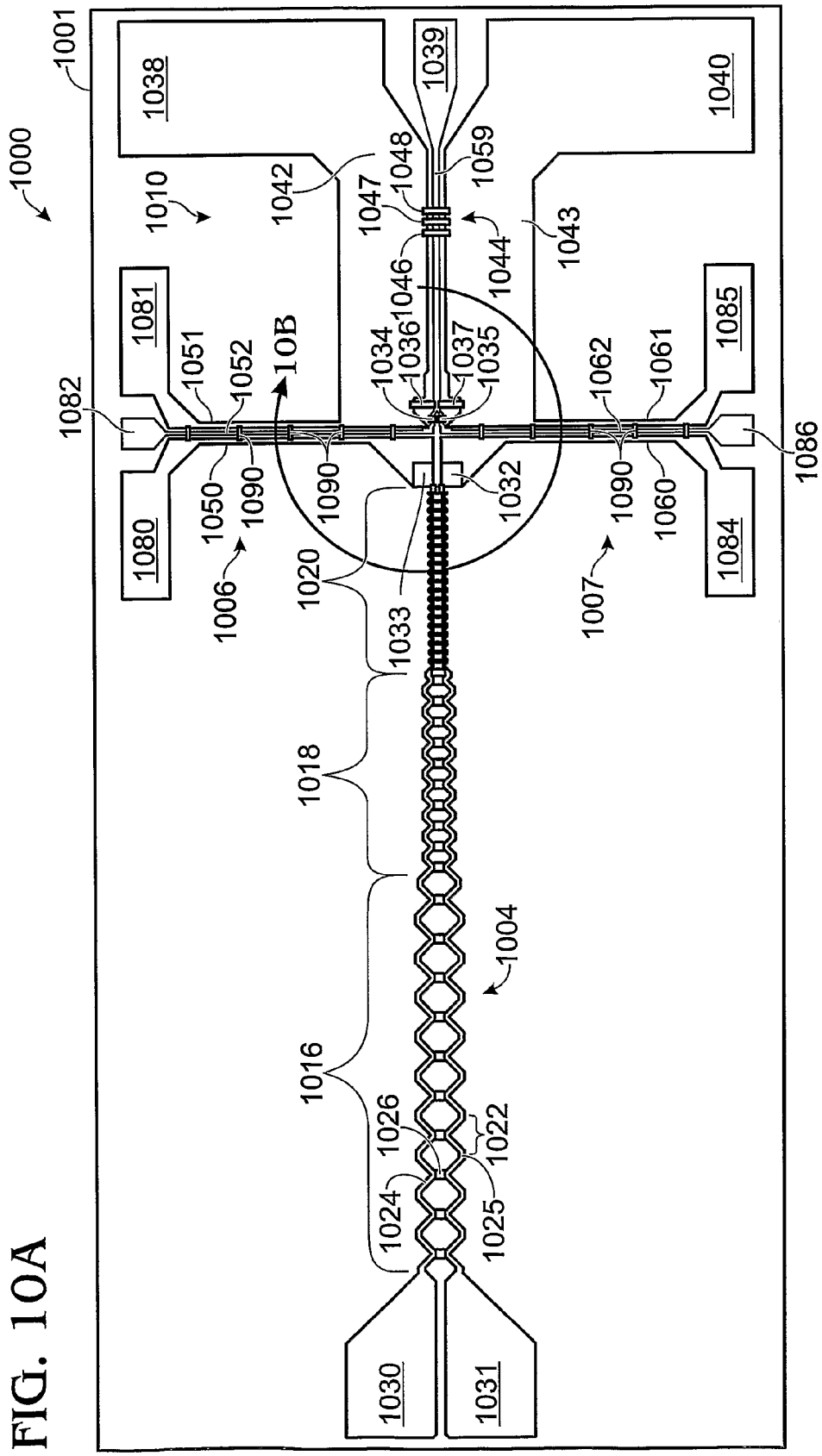
FIGS. 10A-10B illustrate a physical layout of a downconverter that includes an NLTL and waveguides configured to receive differential intermediate frequency signals.
Figure 10B:
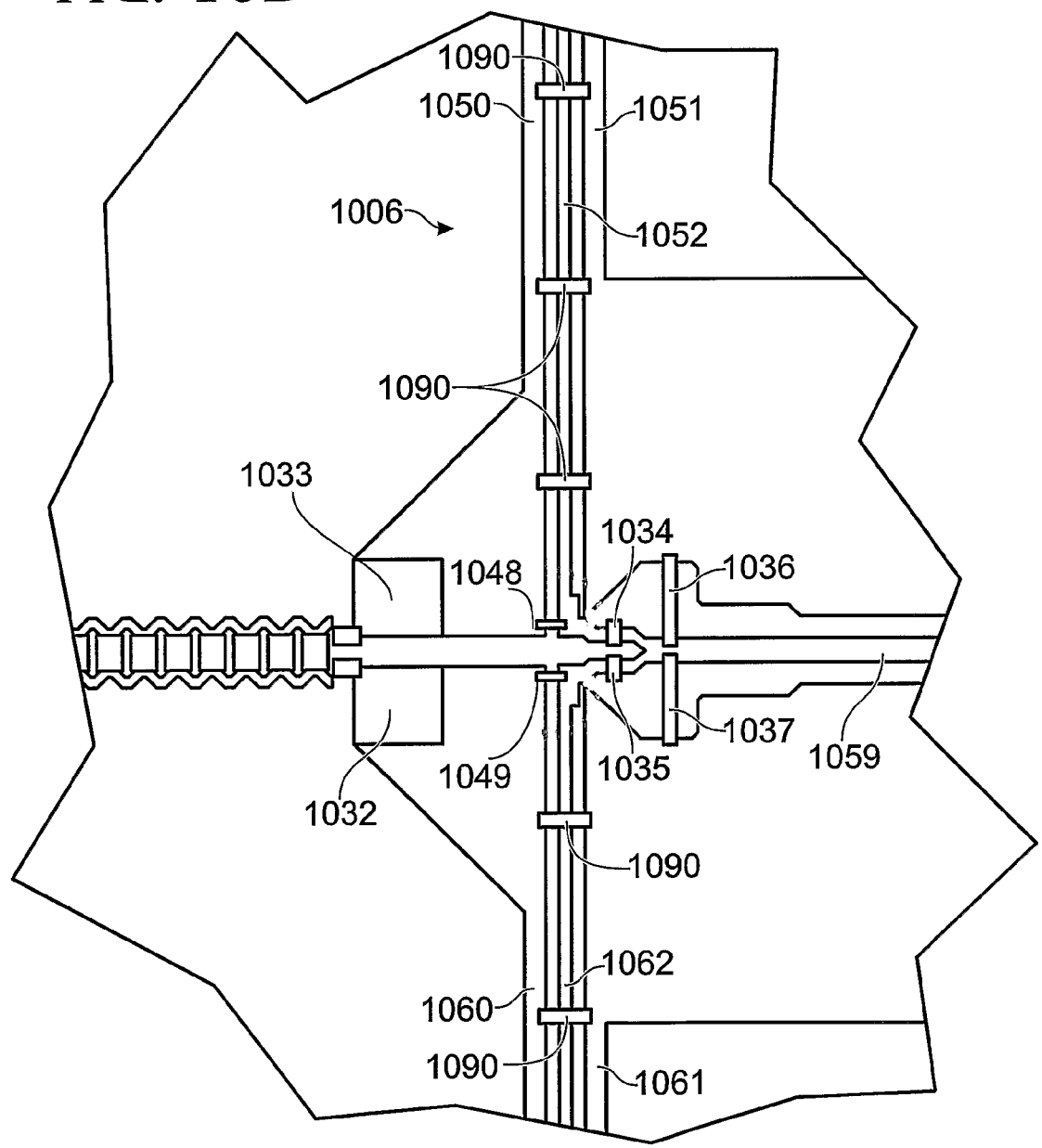

FIGS. 10A-10B are physical layouts of a frequency converter 1000 that includes a stepped NLTL 1004, differential IF waveguide sections 1006, 1007, and an RF waveguide section 1010 that are situated on a semiconductor substrate 1001. The NLTL 1004 includes stepped sections 1016, 1018, 1020 that include series of cells comprising nonparallel coplanar strip waveguide sections and Schottky diodes. For example, an NLTL cell 1022 includes waveguide conductor portions 1024, 1025 that are coupled by a Schottky diode 1026. As shown in FIG. 10, cells of three sizes are used, but fewer or more cells can be used. The NLTL section 1004 also includes strobe launch pads 1030, 1031 configured to receive a sampler strobe or other input signal. Typically waveguide sections and pads are defined on the substrate 1001 as thin layers of gold or other conductor. In addition, NLTL waveguide sections are generally airbridged to contact the Schottky diodes. The NLTL 1004 is coupled to a DC block capacitors 1032, 1033 and is then coupled through termination networks 1048, 1049 before coupling to sampler diodes 1034, 1035 and to 100 Ohm termination resistors 1036, 1037. While the capacitors 1048, 1049 are provided in this example, in other examples resistors, capacitors, inductors, or combinations thereof can be used. In some examples, distinct coupling elements are unnecessary, and capacitive or other coupling between waveguide conductors is adequate.

The RF waveguide section 1010 includes RF launch pads 1038, 1039, 1040 configured to direct an RF input signal along a coplanar waveguide that is defined by outer conductors 1042, 1043 and an inner conductor 1059. The outer conductors 1042, 1043 are electrically connected at a backshort 1044 that is defined by conductors 1046, 1047, 1048 that are conveniently situated below the inner conductor 1059 that can be airbridged. The backshort 1044 tends to reflect portions of a strobe pulse that propagate in a slot waveguide mode from the sampler diodes 1034, 1035 and reflect the portion with a polarity inversion. Input RF signals propagate substantially in a CPW waveguide mode and are substantially unaffected by the backshort 1044.

The IF waveguide sections 1006, 1007 include coplanar waveguides defined by outer conductor portions 1050, 1051 and 1060, 1061 and inner conductors 1052, 1062, respectively. IF signals are communicated from the downconverter 1000 via IF output pads 1080-1082 and 1084-1086. The sampler diodes 1034, 1035 couple IF signals to the IF waveguide sections 1006, 1007 as CPW mode signals and portions of the strobe pulses appear as common mode signals. A plurality of shorts 1090 couples the outer conductor portions and serves to prevent the slot mode for the strobe portions propagating on the IF waveguide sections 1006, 1007 while substantially transmitting IF signals. Outer IF ground pads 1080, 1081 and 1084, 1084 are generally shorted at respective ground conductors and inner pads 1082, 1086 are coupled to respective inner conductors of coaxial cables that are used to transmit IF signals produced by the downconverter 1000. The shorted IF pads tend to reflect common mode strobe portions and, in conjunction with the shorts 1090, strobe portions can be eliminated or reduced in the IF outputs. CPW IF outputs from the IF waveguide sections 1006, 1007 can be combined to produce a total IF signal as shown in, for example, FIG. 5.

EXAMPLE 10

Figure 11A:
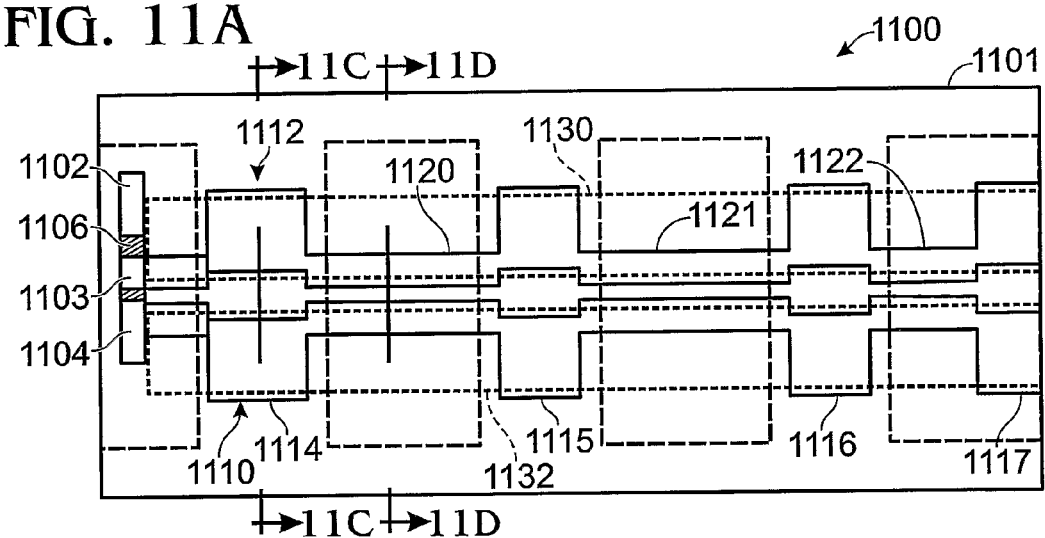
FIG. 11 is a schematic diagram of a waveguide balun.
Figure 11B:
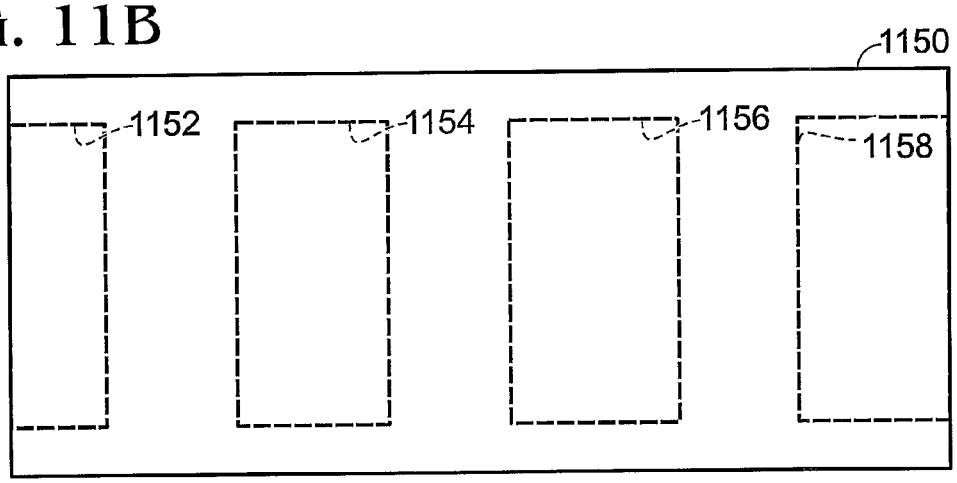

A waveguide balun 1100 is illustrated in FIGS. 11A-11D. For convenience, FIG. 11A shows features found on a back side of the balun substrate 1101 or on a substrate carrier 1150 on which the balun 1100 is situated as dashed lines. Referring to FIG. 11A, the balun 1100 includes input conductors 1102, 1103, 1104 that are configured for coupling to, for example, a coplanar waveguide. The conductors 1102, 1104 are electrically connected with a conductor strip 1106 and are coupled to a first variable width coplanar strip conductor 1110. The input conductor 1103 is coupled to a second variable width coplanar strip conductor 1112. The strip conductors 1110, 1112 and the input conductors 1102-1104 are typically formed of gold or other conductor. The strips conductors 1110, 1112 form a CPS waveguide that has wide gap regions 1114-1117 and narrow gap regions 1120-1122. The narrow and wide gap regions are alternated to provide alternating low waveguide impedance (wide gap) and high waveguide impedance (narrow gap) for common mode signals propagating on the CPS waveguide, while providing substantially constant differential mode impedance. CPS impedance generally depends on a gap/width ratio and mode type. Wide gap/narrow gap separations can be selected to be about ½ of a signal rise time or about ¼ of a signal wavelength, but shorter or longer separations can be used. Lossy conductors 1130, 1132 are situated on a rear surface of the substrate 1101.

Figure 11C:
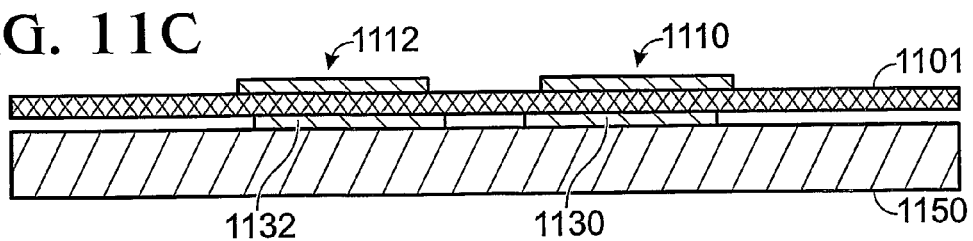
Figure 11D:
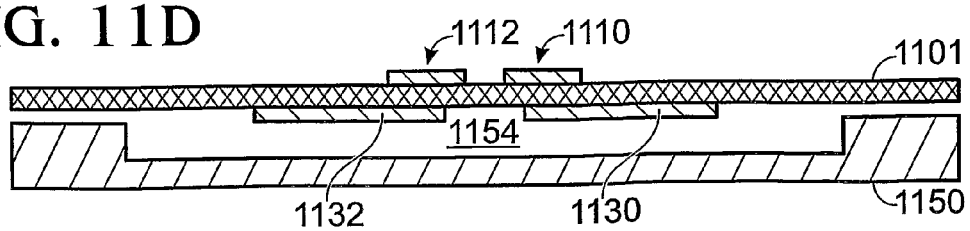

The substrate 1101 is supported by the substrate carrier 1150 that is formed of a conductive material. The nichrome conductors 1130, 1132 are shorted by contact with the substrate carrier at the wide gap regions 1114-1117. The narrow gap regions 1120-1122 are associated with respective carrier cavities 1152, 1154, 1156, 1158 that are configured so that the nichrome conductors 1130, 1132 are located at relatively high field regions and effectively attenuate common mode signals. Cavity dimensions can be selected to have resonant frequencies at or near frequencies to be attenuated. FIG. 11C is a sectional view of the wide gap region 1114 and FIG. 11D is a sectional view of the narrow gap region 1120.

CONCLUSION

Representative upconverters, downconverters, samplers, combiners, and baluns and other systems and system components are described above. It will be apparent that these are examples only, and other configurations are included in the disclosed technology. In the disclosed examples, GaAs Schottky diodes are used as sampler diodes, and resistors are typically formed using nichrome layers. Other processes and materials can be used, and the examples are selected for convenient fabrication. Particular waveguide structures such as, for example, CPW or CPS are used, but other waveguides structures or other combinations of waveguide structures can be used. The disclosed samples are shown based on two or four sampler diodes, but in other examples fewer or more sampler diodes can be used. Signal portions coupled to RF or IF waveguides are typically portions propagating on an associated waveguide such as a CPW or CPW waveguide. Other waveguide structures can be used to store signals for coupling by sampler diodes. In the disclosed examples, one or more of a strobe signal, an RF signal, or an IF signal propagates as a common waveguide mode or a differential waveguide mode while a different signal propagates as a different waveguide mode such as a differential mode so that these signals co-propagate but can still be readily separated as needed for an particular application. Periodic or aperiodic impedance discontinuities can be used to selectively attenuate a particular signal based on waveguide propagation characteristics, but such signals can be selectively coupled instead of attenuated.

In some examples, waveguides are terminated so at to provide an impedance match, an impedance mismatch, or the produce a polarity change upon reflection. For convenience, terminations can provide substantial impedance matching, mismatching, or other configurations such as a time dependent match or mismatch. Multimode waveguides are used to carry different signals in different waveguide modes for convenient delivery or processing.

Multimode waveguides as used in some examples can be based on two or more independent waveguides or coupled waveguides, and it will be apparent that many configurations are possible.

Sampler diodes are situated to provide alternating phase pulses that can modulate or be modulated by IF or other signals. Such alternating phase pulses are typically provided by reflecting a single pulse from a short, but in additional examples a single pulse can be used without an accompanying 180 degree phase shifted pulse. In addition, the disclosed examples are particularly suited for signal processing at bandwidths of up to about 35 GHz, but in other examples, signals of lower or higher bandwidths can be processed. In view of these and other examples, the disclosed examples are not to be taken as limiting in any way, and we claim all novel and non-obvious combinations of the disclosed components, systems, and methods, including the combinations recited in the appended claims.

We claim:

1. A method comprising:
    directing portions of a signal to a first capture waveguide and a second capture waveguide;
    applying a strobe pulse to at least a first sampler diode and a second sampler diode; and
    coupling a first signal corresponding to the portion of a signal propagating on the first capture waveguide to an output waveguide at a first time point and coupling a second signal corresponding to the portion of the signal propagating on the second capture waveguide to the output waveguide at a second time point.

2. The method of claim 1, further comprising processing the strobe pulse to produce a first strobe portion having a first polarity at the first time point and a second strobe portion having a second polarity at the second time point.

3. A sampler, comprising:
    a strobe waveguide defined by at least a first conductor and a second conductor and coupled to propagate a strobe pulse;
    a multimode RF waveguide and a multimode IF waveguide;
    a first sampler diode pair, one diode of the pair having a cathode connected to the RF waveguide and an anode coupled to the multimode IF waveguide, and the other diode of the pair having an anode connected to the RF waveguide and a cathode coupled to the multimode IF waveguide; and
    a second sampler diode pair, one diode of the pair having a cathode connected to the RF waveguide and an anode coupled to the multimode IF waveguide, and the other diode of the pair having an anode connected to the RF waveguide and a cathode coupled to the multimode IF waveguide, wherein the strobe waveguide is configured to couple the strobe pulse to the multimode IF waveguide and the first sampler diode pair and second sampler diode pair so that the multimode IF waveguide is coupled to the multimode RF waveguide in response to the strobe pulse.

4. The sampler of claim 3, further comprising a termination coupled to the RF waveguide.

5. The sampler of claim 3, further comprising a termination coupled to the strobe waveguide.

6. The sampler of claim 3, further comprising a termination coupled to the multimode IF waveguide.

7. The sampler of claim 6, wherein the termination provides a predetermined impedance.

8. The sampler of claim 3, wherein the multimode IF waveguide is coupled to propagate an IF signal in a first waveguide mode and the strobe pulse in a second waveguide mode that is different from the first waveguide mode.

9. The sampler of claim 3, wherein the multimode IF waveguide includes a first waveguide conductor coupled to an anode of one of the diodes of the first pair of sampler diodes and a second waveguide conductor coupled to a cathode of the other of the diodes of the first pair.

10. A sampler, comprising:
a strobe waveguide defined by at least a first conductor and a second conductor;
an RF waveguide and first and second IF waveguides; and
a first sampler diode having a cathode connected to the RF waveguide and an anode connected to the first IF waveguide;
a second sampler diode having an anode connected to the RF waveguide and a cathode connected to the second IF waveguide, wherein the first IF waveguide and the second IF waveguide are configured to be coupled to the RF waveguide in response to a strobe pulse applied to the strobe waveguide.

11. The sampler of claim 10, wherein the IF waveguide and the RF waveguide are coplanar waveguides, and the strobe waveguide is a coplanar strip waveguide.

12. The sample of claim 10, wherein the strobe waveguide is configured to deliver at least a portion of the strobe signal so as to propagate in a first mode on the first and second IF waveguides and the sampler diodes are configured to couple the RF waveguide and the IF waveguides so that a signal coupled from the RF waveguide to the IF waveguides propagates in second waveguide mode that is different than the first waveguide mode.

* * * * *